United States Patent [19]

Gladh et al.

[11] Patent Number: 5,070,313

[45] Date of Patent: Dec. 3, 1991

[54] TUNING ARRANGEMENT FOR COMBINER FILTER HAVING DIELECTRIC WAVEGUIDE RESONATOR AND COACTING TUNING CAPACITANCE

[75] Inventors: Olov H. Gladh, Vällingby; Leif S. Kagstrom, Ekerö, both of Sweden

[73] Assignee: Telefonaktiebolaget L M Ericsson, Stockholm, Sweden

[21] Appl. No.: 619,442

[22] Filed: Nov. 29, 1990

[30] Foreign Application Priority Data

Dec. 20, 1989 [SE] Sweden .............................. 8904293-1

[51] Int. Cl.⁵ .......................... H01P 1/20; H01P 7/10; H03J 3/20
[52] U.S. Cl. ................................ 333/202; 333/219.1; 333/235; 334/82
[58] Field of Search ............ 333/202, 209, 210, 219.1, 333/231, 232, 223, 224, 226, 235; 334/82, 84; 361/297, 298

[56] References Cited

U.S. PATENT DOCUMENTS

| | | | |
|---|---|---|---|
| 2,913,683 | 11/1959 | Mason | 333/224 |
| 4,375,626 | 3/1983 | Hudak | 334/82 X |
| 4,639,699 | 1/1987 | Nishikawa et al. | 333/235 X |

FOREIGN PATENT DOCUMENTS

| | | | |
|---|---|---|---|
| 0296009 | 6/1988 | European Pat. Off. | |
| 2538958 | 7/1984 | France | 333/209 |
| 0263802 | 10/1988 | Japan | 333/219.1 |

OTHER PUBLICATIONS

*Derwent Publications Ltd.*, 89-347134/47 (SU 1462-43-8-A), Feb. 29, 1989.
Patent Abstracts of Japan, vol. 9 nr. 31, E-295, Abstract of JP 59-176906, 6 Oct. 1984.
Patent Abstracts of Japan, vol. nr. 31, E-295, Abstract of JP 59-176905, 6 Oct. 1984.

*Primary Examiner*—Eugene R. LaRoche
*Assistant Examiner*—Seung Ham
*Attorney, Agent, or Firm*—Burns, Doane, Swecker & Mathis

[57] ABSTRACT

The present invention relates to a tuning arrangement for combiner filters which include a dielectric waveguide resonator (3) and a tuning capacitance (4) coacting therewith. According to the invention, the tuning capacitance (4) has the form of a substantially isosceles acute-angled triangle bent to a circular-cylindrical form with the cylinder axis parallel with the waveguide resonator (4). The apex of the triangle is attached to the center of the opposing side. The cylindrical tuning capacitance (4) can be rotated around the cylinder axis, for tuning the combiner filter.

4 Claims, 1 Drawing Sheet

TUNING ARRANGEMENT FOR COMBINER FILTER HAVING DIELECTRIC WAVEGUIDE RESONATOR AND COACTING TUNING CAPACITANCE

TECHNICAL FIELD

The present invention relates to a tuning arrangement for combiner filters of the kind comprising a dielectric waveguide resonator and a tuning capacitance coacting therewith.

PRIOR ART

A combiner filter is a device used to tune the frequency from a transmitter to an antenna. The frequency is tuned through a dielectric waveguide in the form of a ceramic, so-called "puck" incorporated in the filter, wherein the frequency of the waveguide is determined by its dimensions and the material from which it is made. The frequency can be finely adjusted with the aid of a tuning capacitance which is moved perpendicularly towards or away from the waveguide. This capacitance can be a further ceramic "puck" or a ceramic rod, which can be inserted into a central hole in the waveguide. The capacitance may, alternatively, consist of a circular plate or disc. In all of these cases, however, a small movement of the capacitance will result in a large change in the set frequency, i.e. tuning is very sensitive. Consequently, fine tuning of the frequency requires the provision of large mechanical transmission means in the mechanical capacitance tuning device, such that a small displacement of the tuning capacitance will have correspondence in a relatively large change in the setting arrangement. This mechanical transmission means, however, is very space consuming and complicated, and can cause difficulties in handling the arrangement.

DISCLOSURE OF THE INVENTION

The object of the present invention is to avoid the drawbacks associated with present-day tuning arrangements and to provide a tuning arrangement of simple construction and of reliable operation. This object is achieved with a tuning arrangement in which the tuning capacitance has the form of a substantially isosceles acute-angled triangle which is bent to a circularcylindrical shape and where the apex of the triangle is attached to the centre point of the opposing side, and where the cylinder axis is parallel with the waveguide resonator. The combiner filter is tuned by rotating the cylindrical tuning capacitance about the cylinder axis.

The triangle, bent to cylinder form is attached by means of spokes to a rotational shaft whose axis coincides with the cylinder axis. A motor is preferably connected to the rotational shaft, for the purpose of adjusting the filter setting.

In order to enable the tuning arrangement to be adjusted to a rough setting, the tuning capacitance is advantageously made displaceable perpendicularly to the waveguide resonator.

The inventive tuning arrangement affords a number of advantages. One important advantage is that tuning can be effected simply and with great accuracy in a reliable manner. Because the tuning capacitance has the form of an isosceles, acute-angled triangle bent to cylinder form, the active capacitance, i.e. that part of the capacitance which lies closest to the waveguide resonator, can be adjusted positionally in a simple manner and with great precision, by twisting the tuning capacitance.

The advantage afforded by attaching the tuning capacitance to a rotational shaft with the aid of spokes, and connecting the shaft to a motor is that the tuning capacitance can then be maneuvered easily.

Because the tuning capacitance can be displaced perpendicularly to the waveguide resonator, there is afforded the advantage of enabling the tuning arrangement to be readily adjusted to a rough setting, whereafter fine adjustments can be made by twisting the tuning capacitance.

The invention will now be described in more detail with reference to a preferred embodiment thereof and with reference to the accompanying drawing.

BEST MODE FOR CARRYING OUT THE INVENTION

Figure 1:
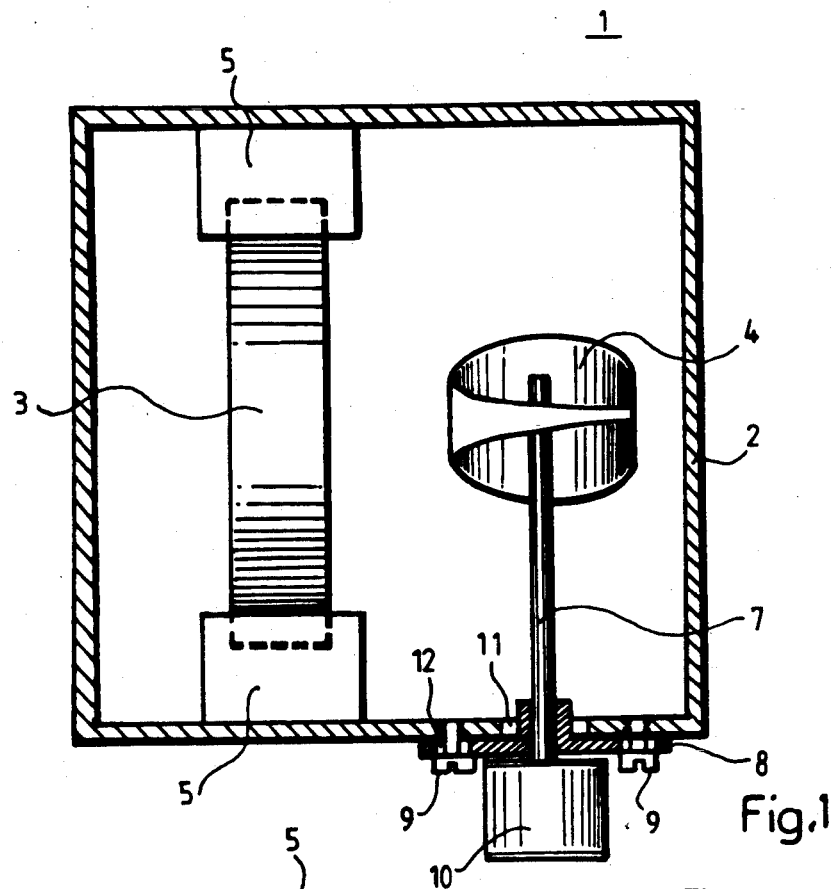
FIG. 1 is a sectional view of a preferred exemplifying embodiment of an inventive tuning arrangement.

FIG. 1 illustrates in section an example of a combiner filter, generally referenced 1, which includes an inventive tuning device. Only those components of the combiner filter required to obtain an understanding of the invention have been included in the Figure. The combiner filter is enclosed in a casing 2 and includes a dielectric waveguide resonator 3 and a tuning capacitance 4. The waveguide resonator 3 is made of ceramic material and is tuned to a determined frequency, contingent on material and dimensions. In the illustrated embodiment, the waveguide resonator 3 has the form of a circular disc or "puck" and is mounted in the casing 2 by means of a schematically indicated holder 5.

Fine adjustments are made to the filter frequency with the aid of the tuning capacitance 4 in coaction with the waveguide resonator. According to the invention, this capacitance has the form of an isosceles, acute-angled triangle which is bent to a circularcylindrical shape, with the apex of the triangle attached at the centre of the opposing side. The cylinder axis is parallel with the waveguide resonator and spaced at a given distance therefrom, as evident from FIG. 1, which shows the tuning arrangement from one side. The cylindrical shape of the tuning capacitance 4 can be seen from FIG. 2, which is a top view of the tuning arrangement. Tuning is carried out by rotating the tuning capacitance 4 about the cylinder axis, wherewith a greater or smaller part of the capacitance is caused to coact with the waveguide resonator 3. In order to enable the tuning capacitance 4 to be rotated in this manner, the capacitance is attached to a rotational shaft 7 by means of spokes 6, the axis of said shaft coinciding with the cylinder axis. The shaft 7 is passed through a schematically illustrated attachment plate 8, which is secured to the casing 2 by means of screws 9 or like fasteners. The attachment plate also functions as a guide for the rotational shaft and attachment of the tuning arrangement. A stepping motor 10 or like device is connected to the shaft 7, for rotation of the tuning capacitance and therewith adjustment to the setting of the tuning arrangement.

Figure 2:
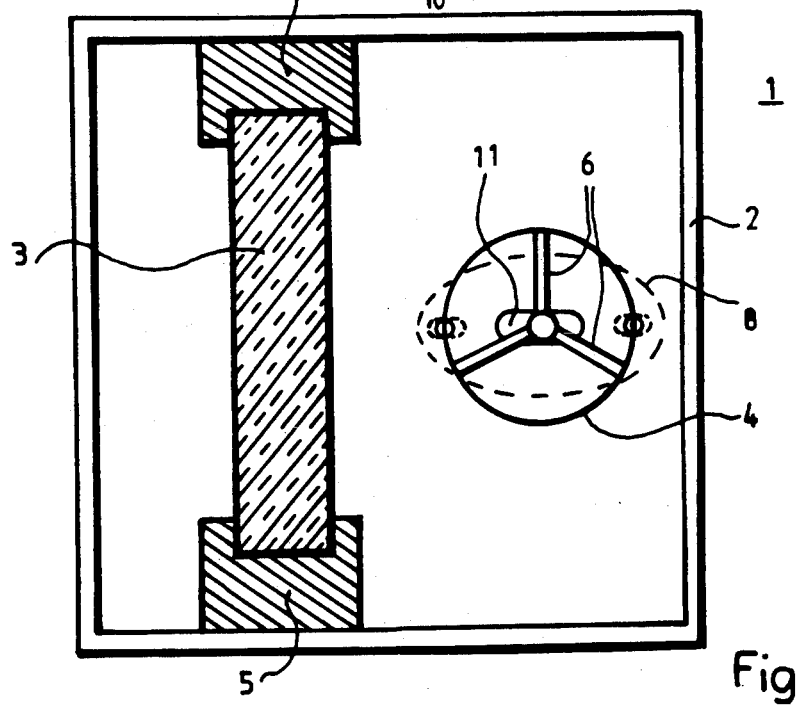
FIG. 2 is a top view of the arrangement illustrated in FIG. 1.

The aforedescribed tuning arrangement enables the frequency of a combiner filter to be finely adjusted with great accuracy. In order to enable the frequency to be roughly adjusted, the whole of the tuning arrangement, i.e. the tuning capacitance 4 with rotational shaft 7 and stepping motor 10, can be displaced perpendicularly in relation to the waveguide resonator 3. This displacement is effected by loosening the attachment plate 8 and moving the plate to a desired position on the casing 2, and then retightening the plate. This is made possible by the fact that the hole 11 for accommodating the rotational shaft 7 in the casing 2 is elongated, as shown in FIG. 2, and by the fact that the screw holes 12 in the attachment plate are correspondingly elongated.

It will be understood that the invention is not restricted to the aforedescribed and illustrated embodiment, and that modifications can be made within the scope of the following Claims.

We claim:

1. A tunable filter comprising:
   a dielectric waveguide resonator having a principal axis;
   a hollow cylindrical tuning capacitance formed of a substantially isosceles triangle member; and
   means for rotating said hollow cylindrical capacitance around an axis substantially parallel to said principal axis of said dielectric waveguide resonator.

2. The tunable filter of claim 1 wherein said means for rotating comprises a rotational shaft that coincides with an axis of symmetry of said hollow cylindrical tuning capacitance and spokes connected between said rotational shaft and said hollow cylindrical tuning capacitance.

3. The tunable filter of claim 2 further comprising a motor connected to said rotational shaft.

4. The tunable filter of claim 3 further comprising means for displacing said hollow cylindrical tuning capacitance so as to vary a distance between said principal axis of said dielectric waveguide resonator and said axis of symmetry of said cylindrical tuning capacitance to provide for coarse tuning of said tunable filter.

* * * * *